US011295825B2

United States Patent
Omid-Zohoor et al.

(10) Patent No.: US 11,295,825 B2
(45) Date of Patent: Apr. 5, 2022

(54) MULTI-TIME PROGRAMMABLE NON-VOLATILE MEMORY CELL

(71) Applicant: Lattice Semiconductor Corporation, Portland, OR (US)

(72) Inventors: Farrokh Kia Omid-Zohoor, San Jose, CA (US); Nguyen Duc Bui, San Jose, CA (US); Binh Ly, San Jose, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 16/285,037

(22) Filed: Feb. 25, 2019

(65) Prior Publication Data

US 2019/0189231 A1    Jun. 20, 2019

Related U.S. Application Data

(63) Continuation of application No. 15/715,807, filed on Sep. 26, 2017, now Pat. No. 10,217,521, which is a
(Continued)

(51) Int. Cl.
*G11C 17/16*    (2006.01)
*G11C 17/18*    (2006.01)
(Continued)

(52) U.S. Cl.
CPC .............. *G11C 17/16* (2013.01); *G11C 17/18* (2013.01); *H01L 27/11206* (2013.01); *H01L 27/11582* (2013.01); *H01L 28/00* (2013.01)

(58) Field of Classification Search
CPC .. G11C 17/00–17/18; H01L 27/112–27/11293
See application file for complete search history.

(56) References Cited

U.S. PATENT DOCUMENTS 5,200,652 A * 4/1993 Lee ................. G11C 17/16
326/10
6,642,084 B2 * 11/2003 Carson .............. G11C 17/14
257/259
(Continued)

FOREIGN PATENT DOCUMENTS

| CN | 104347637 | 2/2015 |
| EP | 0417484 | 6/1995 |
| EP | 2408001 | 1/2012 |

OTHER PUBLICATIONS

IPO, Combined Search and Examination Report for GB1601154.6, Intellectual Property Office of the United Kingdom, pp. 1-9, dated Mar. 2016.
(Continued)

*Primary Examiner* — Ajay Ojha
(74) *Attorney, Agent, or Firm* — Haynes and Boone, LLP (57) ABSTRACT

A non-volatile programmable bitcell has a read enable device with a source coupled with a bitline, an anti-fuse device with a gate coupled with a first write line, a drain coupled with a supply voltage and a source coupled with a drain of the read enable device. The bitcell has a fuse device coupled between a second write line and the drain of the read enable device. A magnitude of current flowing in the bitline, when the read enable device is enabled for reading, is dependent both on (1) a voltage level applied to the first write line and anti-fuse device state and on (2) a voltage level applied to the second write line and fuse device state. Usages include in a memory array, such as for FPGA configuration memory. The bitcell can be used as a multi-time programmable element, or to store multiple bit values.

19 Claims, 6 Drawing Sheets

Related U.S. Application Data continuation of application No. PCT/US2016/049082, filed on Aug. 26, 2016.

(60) Provisional application No. 62/212,686, filed on Sep. 1, 2016.

(51) Int. Cl.
  *H01L 27/112* (2006.01)
  *H01L 27/11582* (2017.01)
  *H01L 49/02* (2006.01)

(56) References Cited

U.S. PATENT DOCUMENTS

| | | | |
|---|---|---|---|
| 6,667,902 B2 | 12/2003 | Peng | |
| 6,700,151 B2 | 3/2004 | Peng | |
| 7,402,855 B2 | 7/2008 | Kurjanowicz | |
| 7,546,498 B1 * | 6/2009 | Tang | G06F 21/76 713/182 |
| 7,715,219 B2 | 5/2010 | Monreal | |
| 8,199,590 B1 | 6/2012 | Novosel et al. | |
| 8,547,763 B2 * | 10/2013 | Son | G11C 17/16 365/185.01 |
| 8,836,076 B2 | 9/2014 | Nagayama | |
| 9,013,910 B2 * | 4/2015 | Chen | G11C 17/18 257/317 |
| 9,190,166 B2 | 11/2015 | Kanda et al. | |
| 9,780,030 B2 | 10/2017 | Oda et al. | |
| 2003/0071315 A1 | 4/2003 | Peng | |
| 2007/0076463 A1 | 4/2007 | Keshavarzi et al. | |
| 2008/0170457 A1 | 7/2008 | Kothandaraman | |
| 2009/0086521 A1 * | 4/2009 | Herner | G11C 11/5685 365/63 |
| 2010/0128512 A1 * | 5/2010 | Ohnishi | G11C 7/18 365/145 |
| 2010/0164603 A1 | 7/2010 | Hafez et al. | |
| 2010/0220511 A1 | 9/2010 | Kurjanowicz | |
| 2011/0176368 A1 | 7/2011 | Kalnitsky et al. | |
| 2011/0317468 A1 | 12/2011 | Terzioglu | |
| 2012/0014200 A1 | 1/2012 | Buer | |
| 2013/0121057 A1 | 5/2013 | Le Neel | |
| 2013/0229882 A1 | 9/2013 | Hafez et al. | |
| 2014/0268984 A1 * | 9/2014 | Yanagisawa | G11C 17/16 365/96 |

OTHER PUBLICATIONS

ISA of KIPO, Transmittal of International Search Report with Written Opinion for PCT/US2016/049082, Korean Intellectual Property Office, South Korea, pp. 1-11, dated Nov. 2016.

* cited by examiner

TABLE I. PROGRAM SELECTED CELL

| COL/ROW | WP | WR | BL | PROGRAM |
|---|---|---|---|---|
| SC/SR | Vpp | Vinh | 0 | YES |
| UC/SR | Vpp | Vinh | Vinh | NO |
| SC/UR | 0 | 0 | 0 | NO |
| UC/UR | 0 | 0 | Vinh | NO |

TABLE II. READ SELECTED CELL

| COL/ROW | WP | WR | BL | SENSE I |
|---|---|---|---|---|
| SC/SR | Vrd | Vdd | SENSE I | YES |
| UC/SR | Vrd | Vdd | Vrd | NO |
| SC/UR | 0 | 0 |  | NO |
| UC/UR | 0 | 0 | Vrd | NO |

TABLE III. BLOW FUSE DEVICE OF SELECTED CELL

| COL/ROW | WP | WR | BL | BL' | PROGRAM |
|---|---|---|---|---|---|
| SC/SR | Vdd | Vdd | 0 | Vpp | YES |
| UC/SR | Vdd | Vdd | 0 | 0 | NO |
| SC/UR | 0 | 0 | 0 | Vpp | NO |
| UC/UR | 0 | 0 | 0 | 0 | NO |

TABLE IV. READ SELECTED CELL

| COL/ROW | WP | WR | BL | BL' | SENSE I |
|---|---|---|---|---|---|
| SC/SR | Vdd | Vdd | SENSE I | Vrd | YES |
| UC/SR | Vdd | Vdd | 0 | 0 | NO |
| SC/UR | 0 | 0 |  | Vrd | NO |
| UC/UR | 0 | 0 | 0 | 0 | NO |

TABLE V. BLOW ANTI-FUSE DEVICE OF SELECTED CELL

| COL/ROW | WP | WR | BL | BL' | PROGRAM |
|---|---|---|---|---|---|
| SC/SR | Vpp | Vinh | 0 | FLOAT | YES |
| UC/SR | Vpp | Vinh | Vinh | FLOAT | NO |
| SC/UR | 0 | 0 | 0 | FLOAT | NO |
| UC/UR | 0 | 0 | Vinh | FLOAT | NO |

TABLE VI. READ SELECTED CELL

| COL/ROW | WP | WR | BL | BL' | SENSE I |
|---|---|---|---|---|---|
| SC/SR | Vrd | Vdd | SENSE I | FLOAT | YES |
| UC/SR | Vrd | Vdd | Vrd | FLOAT | NO |
| SC/UR | 0 | 0 |  | FLOAT | NO |
| UC/UR | 0 | 0 | Vrd | FLOAT | NO |

TABLE VII. BLOW ANTI-FUSE DEVICE OF SELECTED CELL

| COL/ROW | WP | WR | BL | WP' | PROGRAM |
|---|---|---|---|---|---|
| SC/SR | Vpp | Vinh | 0 | FLOAT | YES |
| UC/SR | Vpp | Vinh | Vinh | FLOAT | NO |
| SC/UR | 0 | 0 | 0 | FLOAT | NO |
| UC/UR | 0 | 0 | Vinh | FLOAT | NO |

TABLE VIII. READ SELECTED CELL

| COL/ROW | WP | WR | BL | WP' | SENSE I |
|---|---|---|---|---|---|
| SC/SR | Vrd | Vdd | SENSE I | FLOAT | YES |
| UC/SR | Vrd | Vdd | Vrd | FLOAT | NO |
| SC/UR | 0 | 0 |  | FLOAT | NO |
| UC/UR | 0 | 0 | Vrd | FLOAT | NO |

TABLE IX. BLOW FUSE OF SELECTED CELL

| COL/ROW | WP | WR | BL | WP' | PROGRAM |
|---|---|---|---|---|---|
| SC/SR | FLOAT | Vdd | 0 | Vpp | YES |
| UC/SR | FLOAT | Vdd | Vinh | Vpp | NO |
| SC/UR | FLOAT | 0 | 0 | 0 | NO |
| UC/UR | FLOAT | 0 | Vinh | 0 | NO |

TABLE X. READ SELECTED CELL

| COL/ROW | WP | WR | BL | WP' | SENSE I |
|---|---|---|---|---|---|
| SC/SR | FLOAT | Vdd | SENSE I | Vrd | YES |
| UC/SR | FLOAT | Vdd | Vdd | Vrd | NO |
| SC/UR | FLOAT | 0 |  | 0 | NO |
| UC/UR | FLOAT | 0 | Vdd | 0 | NO |

FIG. 8

MULTI-TIME PROGRAMMABLE NON-VOLATILE MEMORY CELL

CROSS REFERENCE TO RELATED APPLICATIONS

This application is a continuation of U.S. patent application Ser. No. 15/715,807 filed Sep. 26, 2017, which is a continuation of PCT Application No. PCT/US2016/049082, filed Aug. 26, 2016, which claims priority from U.S. Provisional Application No. 62/212,686, filed Sep. 1, 2015, all of which are incorporated herein by reference in their entirety for all purposes.

BACKGROUND

Field

The present invention relates to integrated circuits and, more specifically, to integrated circuits having programmable non-volatile memory cells.

Description of Related Art

This section introduces aspects that may help facilitate a better understanding of aspects of the disclosure. Accordingly, the statements of this section are to be read in this light and are not to be understood as admissions about what is prior art or what is not prior art.

A one-time-programmable (OTP) non-volatile memory cell is a set of integrated circuitry that can be programmed one time to have a permanent binary value. In one type of OTP cell, the "unprogrammed" cell has a default, low-current state when the OTP cell is read, which, depending on the logic applied, can be interpreted as corresponding to either a binary value of 0 or a binary value of 1, while the "programmed" cell has a permanent, high-current state when the OTP cell is read, which would be interpreted as corresponding to the other binary value. OTP cells have many different applications, including use in non-volatile configuration memory (NVCM).

Figure 1:
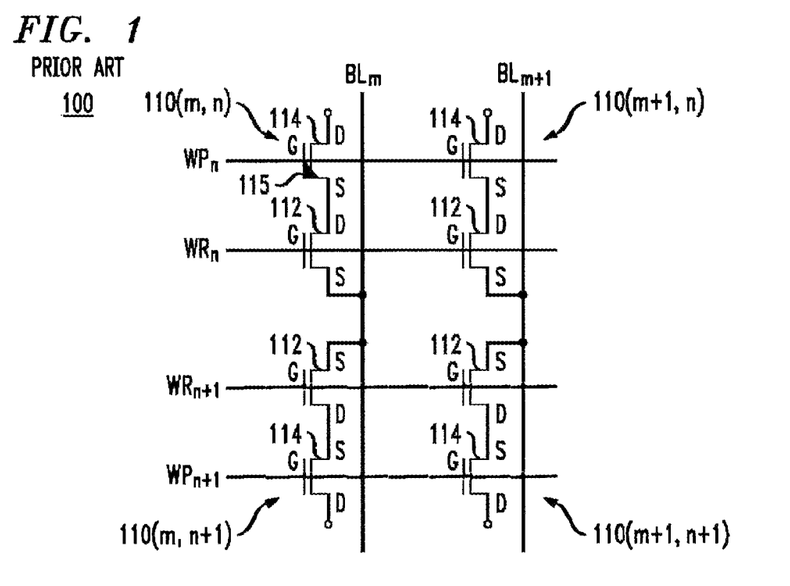
FIG. 1 is a schematic circuit diagram of a (2×2) array of conventional n-type one-time programmable (OTP) non-volatile memory cells.

FIG. 1 is a schematic circuit diagram of a (2×2) array 100 of four conventional n-type OTP cells 110, where each OTP cell 110 comprises an n-type access (transistor) device 112 and an n-type anti-fuse (transistor) device 114. As indicated in FIG. 1, the (2×2) array 100 is part of a larger array (not shown), where the four OTP cells 110 are located in the mth and (m+1)th columns and the nth and (n+1)th rows of that larger array.

As shown in FIG. 1, for each OTP cell 110, the gate (G) of the access device 112 is connected to a corresponding read word line WR, the gate of the anti-fuse device 114 is connected to a corresponding programming word line WP, the source (S) of the access device 112 is connected to a corresponding bit line BL, the drain (D) of the access device 112 is connected to the source of the anti-fuse device 114, and the drain of the anti-fuse device 114 is floating (i.e., not connected to any driven voltage node). In terms of the disclosure, the term "voltage level" as being applied to a particular line, such as a write line, includes floating that line, as well as actively applying a voltage of some polarity (see e.g., FIG. 7) Each OTP cell 110 is accessed via the corresponding read and programming word lines WR and WP, and the program state of each OTP cell 110 is determined by sensing the current in the corresponding bit line BL using sense circuitry (not shown) connected to the bit line. One or more OTP cells 110 in array 100 can be programmed sequentially (i.e., one at a time) in any desired order as follows.

Figure 2:
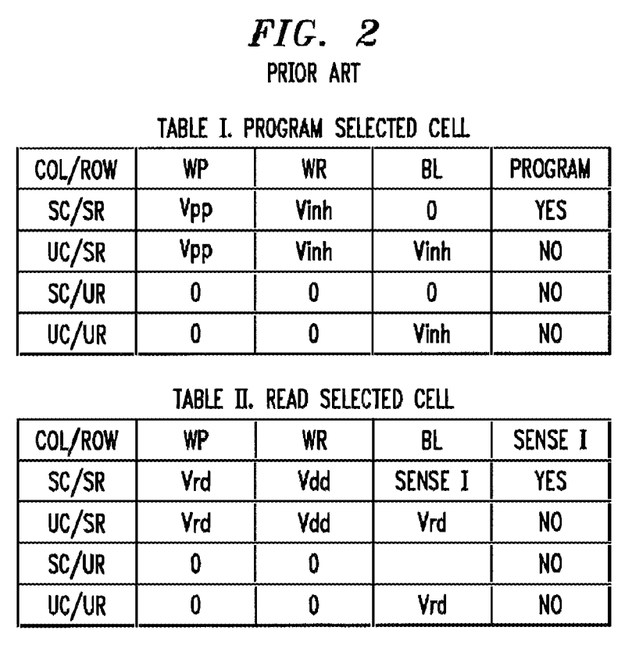
FIG. 2 presents Table I and II, which respectively show the voltages to be applied to program and read an OTP cell of FIG. 1.

Table I of FIG. 2 shows the voltages to be applied to program a selected OTP cell 110 in FIG. 1. The selected OTP cell 110 is the cell that is located in a selected column (SC) and a selected row (SR) of the array. Every other cell in the array is located in either an unselected column (UC) or an unselected row (UR) or both. Table I applies to both the (2×2) array 100 shown in FIG. 1 as well as the larger array (not shown) of which the array 100 is only part.

For example, when the OTP cell 110(m,n) is the selected cell, then the selected column is the mth column (i.e., SC=m), and the selected row is the nth row (i.e., SR=n). In that case, every other column (including the (m+1)th column) is an unselected column (e.g., UC=(m+1)), and every other row (including the (n+1)th row) is an unselected row (e.g., UR=(n+1)).

As shown in Table I, to program a selected OTP cell 110, an appropriate, relatively high, programming voltage Vpp is applied to the programming word line WP of the selected row, a ground voltage (e.g., 0) is applied to the programming word line WP of each unselected row, an appropriate voltage Vinh is applied to the read word line WR of the selected row, a ground voltage is applied to the read word line WR of each unselected row, a ground voltage is applied to the bit line BL of the selected column, and the voltage Vinh is applied to the bit line BL of each unselected column.

With the voltages of Table I applied, for the selected OTP cell 110 in the selected column and the selected row, the access device 112 will be turned on, and a high-voltage difference (i.e., at or near Vpp) will be applied between the gate and source of the anti-fuse device 114, resulting in a permanent breakdown of the gate-oxide layer separating the gate terminal from the source and drain terminals, leaving a permanent conduction path through that gate-oxide layer. In FIG. 1, OTP cell 110(n,m) is a programmed OTP cell having a permanent conduction path 115 through the gate-oxide layer of its anti-fuse device 114.

For each unselected OTP cell 110 in the selected row, but in an unselected column, the access device 112 will be turned on, but the voltage difference between the gate and source of the anti-fuse device 114 will be only (Vpp-Vinh), where Vinh is selected such that the gate-oxide layer of the anti-fuse device 114 will not break down when that gate-to-source voltage difference is applied. For each unselected OTP cell 110 in an unselected row, the access device 112 will be turned off, and the gate-oxide layer of the anti-fuse device 114 will also not break down.

After the array 100 has been programmed, one or more OTP cells 110 will be programmed cells with permanent conduction paths through their anti-fuse gate-oxide layers, while the remaining OTP cells 110 will be unprogrammed cells with their anti-fuse gate-oxide layers intact. The program states of the OTP cells 110 of the programmed array 100 can be determined in any desired order as follows.

Table II of FIG. 2 shows the voltages to be applied in order to read (i.e., determine the program state of) a selected OTP cell 110 in FIG. 1. In particular, an appropriate voltage Vrd is applied to the programming word line WP of the selected row, a ground voltage is applied to the programming word line WP of each unselected row, an appropriate voltage Vdd is applied to the read word line WR of the selected row, a ground voltage is applied to the read word line WR of each unselected row, the voltage Vrd is applied to the bit line BL of each unselected column, and the current in the bit line BL of the selected column is sensed using the sense circuitry for that bit line. In some implementations, Vrd is Vdd. In many implementations, making Vrd the same voltage as Vdd avoids needing separate circuitry to supply a separate Vrd. However, implementations may supply a Vrd different from Vdd.

With the voltages of Table II applied, for the selected OTP cell 110 in the selected column and the selected row, the access device 112 will be turned on. If the selected OTP cell 110 is an unprogrammed cell having an intact anti-fuse gate-oxide layer, then little if any current will flow from the anti-fuse device 114 through the turned-on access device 112 to the bit line BL. If, however, the selected OTP cell 110 is a programmed cell having a permanent conduction path in its anti-fuse gate-oxide layer, then a significant amount of current will flow from the programming word line WP through the permanent conduction path in the anti-fuse device 114 and through the turned-on access device 112 to the bit line BL. Thus, an unprogrammed OTP cell 110 will have a (relatively) low-current state when read, while a programmed OTP cell 110 will have a (relatively) high-current state when read. Depending on the logic applied by the sense circuitry, the low-current state will be interpreted as being either a binary value of 0 or a binary value of 1, while the high-current state will be interpreted as being the other binary value.

For each unselected OTP cell 110 in the selected row, but in an unselected column, the access device 112 will be turned on, but any current in the corresponding (unselected) bit line BL will be ignored. If such an unselected OTP cell 110 is an unprogrammed cell, then little if any current will flow through the intact anti-fuse gate-oxide layer to the unselected bit line BL. If such an unselected OTP cell 110 is a programmed cell, then the voltage Vrd applied to the unselected bit line BL will prevent any significant current from flowing from the program word line WP to that bit line BL.

For each unselected OTP cell 110 in an unselected row, the access device 112 will be turned off, and little if any current will flow to the bit line BL whether the OTP cell 110 is an unprogrammed cell or a programmed cell.

Once an OTP cell 110 is programmed to have a permanent conduction path and a corresponding permanent high-current state, it cannot be subsequently reprogrammed to have a different state.

U.S. Pat. No. 6,700,151, the teachings of which are incorporated herein by reference in their entirety, describes anti-fuse devices that are said to be programmed two times: first by stressing the device's gate oxide until a so-called "soft breakdown" occurs to transition the anti-fuse device from a low-current state to a mid-current state and then subsequently by increasing the breakdown of the gate oxide to transition the cell from the mid-current state to a high-current state.

SUMMARY

In one aspect, the disclosure relates to a non-volatile programmable memory bitcell that has a read enable device with a source coupled with a bitline, an anti-fuse device with a gate coupled with a first write line, a drain coupled with a supply voltage and a source coupled with a drain of the read enable device, and a fuse device coupled between a second write line and the drain of the read enable device. The respective state of each of the anti-fuse and fuse device is programmed or unprogrammed, and a magnitude of current flowing in the bitline, when the read enable device is enabled for reading, is dependent both on (1) a voltage level applied to the first write line and a state of the anti-fuse device and (2) a voltage level applied to the second write line and a state of the fuse device.

An embodiment of such a bitcell can be used as a multiple-time programmable non-volatile memory bitcell. In one approach, the fuse device of such bitcell is programmed first. A bitcell is read by applying a set of read voltages, characterizing current in the bitline, and interpreting the characterization of the current in the bitline. For example, during reading, a pre-determined voltage setup can be applied to wordlines for each of the anti-fuse and fuse devices. If both devices are unprogrammed, then the bitline will have relatively high current (due to relative low resistance of intact fuse). If the fuse device is programmed and the anti-fuse device is not programmed, then the current in the bitline will be relatively low (leakages primarily). If the fuse device was programmed, and then the anti-fuse device was programmed (a second time the bitcell was programmed), then the current will be between the relatively high and relatively low values, because more current will flow through the anti-fuse device in a blown state than in an unblown state. A mapping between these current levels and a logical value (e.g., a binary one or zero) can be handled by control or management circuitry for the memory array. For example, the unprogrammed high current level can be assigned to binary zero, and the fuse programmed low current level can be assigned to a binary one. Bitcells once-programmed can be returned to a binary zero (second programming) by programming the anti-fuse device and interpreting an associated amount of current in the bitline as a binary zero.

In another embodiment, the present invention is a method for programming a two-dimensional array of the MTP cells of the present invention. The method comprises programming a first subset of the MTP cells for a first time to provide a once-programmed array of the MTP cells comprising the first subset of once-programmed MTP cells and a first remainder subset of unprogrammed MTP cells. The MTP cells can be programmed a second time by once programming the first remainder subset of unprogrammed MTP cells, and the programming a selection of the MTP cells to form a twice-programmed MTP cell subset.

In another aspect, the disclosure relates to a method of reading an MTP cell and/or an array of MTP cells according to the disclosure. The method comprises applying a set of read voltages to terminals of the MTP cell (such as in a selected row of MTP cells) and sensing current in a bitline (such as a bitline for each column in the selected row) corresponding to a read current provided by the MTP cell and determining a binary value for the MTP cell based on the sensed read current.

Each bitcell may comprise a single anti-fuse one-time programmable memory element and one or more fuse one-time programmable memory elements. Each fuse one-time programmable memory element can be coupled between the drain of the access device and a respective different read enable signal line. In some implementations each read enable signal is a word line coupled with multiple bitcells in a row of an array.

An aspect of the disclosure comprises a memory array of non-volatile bitcells arranged as an n by m matrix of rows and columns, each bitcell has a respective plurality of one-time programmable elements. The memory array comprises control logic configured to present the non-volatile configuration memory as a n×m matrix of bit locations, each bit location capable of being programmed once for each of the plurality of one-time programmable elements in that memory cell. The memory array may be used as storage for configuration data used for configuring a programmable logic device. The memory array may be formed on the same semiconductor substrate as devices forming the programmable logic device. The programmable logic device includes circuitry for accessing configuration data from the memory array and using that configuration data to configure logic elements of the programmable logic device. The bitcells of the memory array may each comprise one anti-fuse element, and one or more fuse elements, and each of the bitcells requires no more area on a semiconductor substrate than a single-bit anti-fuse memory cell requires.

In a further aspect of the disclosure, a programmable logic device comprises logic elements that are configurable using configuration data; a non-volatile configuration memory for storing the configuration data, the non-volatile configuration memory comprising a plurality of memory cells, each memory cell comprising a respective plurality of one-time programmable elements; control logic configured for programming the non-volatile configuration memory with a first set of configuration data by programming a first selection of the one-time programmable elements of at least a portion of the plurality of memory cells, and to reprogram the non-volatile configuration memory with a second set of configuration data by programming a second selection of the one-time programmable memory elements of at least a portion of the plurality of memory cells, wherein the first selection and the second selection of the one-time programmable memory elements can have elements in common, and the reprogramming causes the first set of configuration data to be overwritten by the second set of configuration data, and the non-volatile configuration memory is readable using a single set of read voltages.

A further aspect of the disclosure relates to a Non-Volatile (NV) memory circuit, with a bitline, a plurality of access devices dividing the bitline into sections and a plurality of NV memory elements. Two or more of the plurality of NV memory elements are electrically coupled to the bitline through a single one of the plurality of access devices. Each NV memory element has a word line to which a voltage can be applied, and each of the NV memory elements can be programmed by application of a voltage potential across a one-time programmable physical structure. A programmed value of any one of the NV memory elements is readable by a read process comprising applying a set of read voltages to the word lines of the NV memory elements and activating the access device that couples that NV memory element to the bitline. Such a circuit can have NV memory elements that comprise both fuse one-time programmable physical structures in which programming occurs by increasing resistance of the fuse and anti-fuse one-time programmable physical structures in which programming occurs by decreasing resistance of the anti-fuse.

A further aspect pertains to semiconductor device with a two-dimensional array of NV memory cells arranged in rows and columns with a bitline for each column, and sense circuitry coupled to evaluate an amount of current flowing in an activated bit line during a read operation. Each NV memory cell comprises a plurality of NV memory elements, each of which is programmable separately from the other NV memory elements of that memory cell. Each NV memory cell also has an access device coupled to the bitline for the column of that NV memory cell, to receive a respective amount of current from any of the memory elements in that memory cell. The respective amount of current for each of the NV memory elements is dependent on whether that NV memory element has been programmed or not. The access device is configured to respond to a control signal by allowing received current to flow into the coupled bitline. There also are a plurality of word lines for each row, each word line corresponding to a respective different NV memory element in the NV memory cells of that row; and control circuitry configured to selectively apply voltage levels to the word lines in order to read a value from the NV memory elements of a selected row.

BRIEF DESCRIPTION OF THE DRAWINGS

Aspects of the disclosure will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 3:
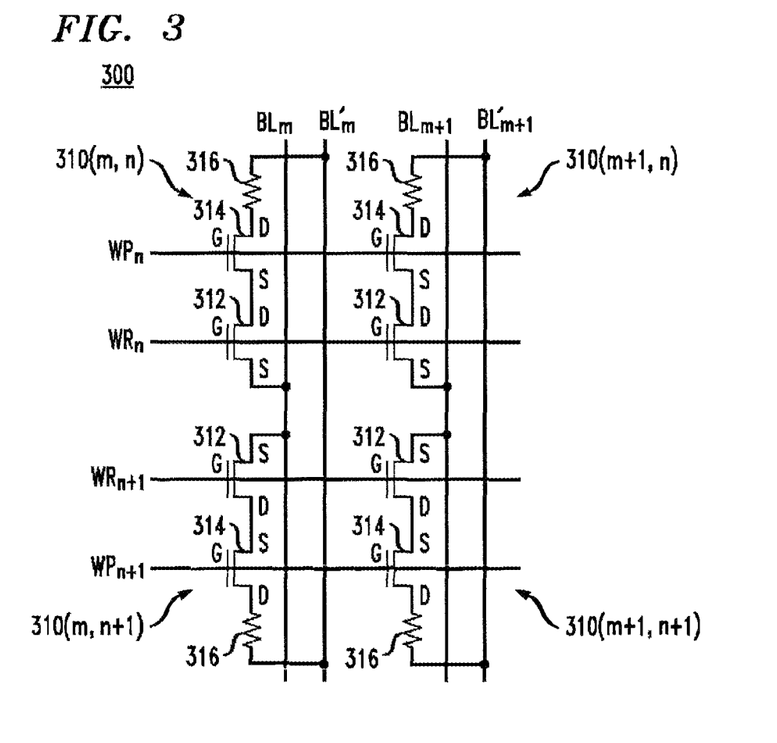
FIG. 3 is a schematic circuit diagram of a (2×2) array of four n-type two-time programmable (TTP) non-volatile memory cells.

FIG. 3 is a schematic circuit diagram of a (2×2) array 300 of four n-type two-time programmable (TTP) non-volatile memory cells 310, according to one embodiment of the invention, where each TTP cell 310 comprises an n-type access (transistor) device 312, an n-type anti-fuse (transistor) device 314, and a fuse (resistor) device 316. As indicated in FIG. 3 and analogous to the (2×2) array 100 of FIG. 1, the (2×2) array 300 is part of a larger array (not shown), where the four TTP cells 310 are located in the nth and (n+1)th rows and the mth and (m+1)th columns of that larger array.

As described further below, fuse device 316 may be implemented using any suitable (two-terminal) element whose resistance will permanently change when a certain amount of current flows through it or a certain level of voltage is applied (or develops) across it. In certain implementations, fuse device 316 is a resistor that is susceptible to electromigration, which significantly and permanently increases the resistance level of the device when a sufficiently high voltage is applied across its terminals. Fuse device 316 can be, for example (and without limitation), (i) the silicided resistance of the drain of the anti-fuse device 314 or (ii) a contact that connects the metal 1 layer to the drain of the anti-fuse device 314 or (iii) a via that connects the metal 2 layer to the metal 1 layer of the drain of the anti-fuse device 314.

Anti-fuse device 314 is implemented as a thin-oxide transistor having a relatively thin gate-oxide layer, while access device 312 is implemented as a thin-oxide transistor or a thick-oxide transistor having a relatively thick gate-oxide layer.

As shown in FIG. 3, for each TTP cell 310, the gate of the access device 312 is connected to a corresponding read word line WR, the gate of the anti-fuse device 314 is connected to a corresponding programming word line WP, the source of the access device 312 is connected to a corresponding first bit line BL, the drain of the access device 312 is connected to the source of the anti-fuse device 314, the drain of the anti-fuse device 314 is connected to one side of the fuse device 316, and the other side of the fuse device 316 is connected to a corresponding second bit line BL'. Each TTP cell 310 is accessed via the corresponding read and programming word lines WR and WP and the corresponding second bit line BL', and the program state of each TTP cell 310 is determined by sensing the current in the corresponding bit line BL using sense circuitry (not shown) connected to that bit line.

As described further below, each TTP cell 310 in array 300 can be programmed two times: first, by blowing the fuse device 316 and second, by blowing the anti-fuse device 314.

Figure 4:
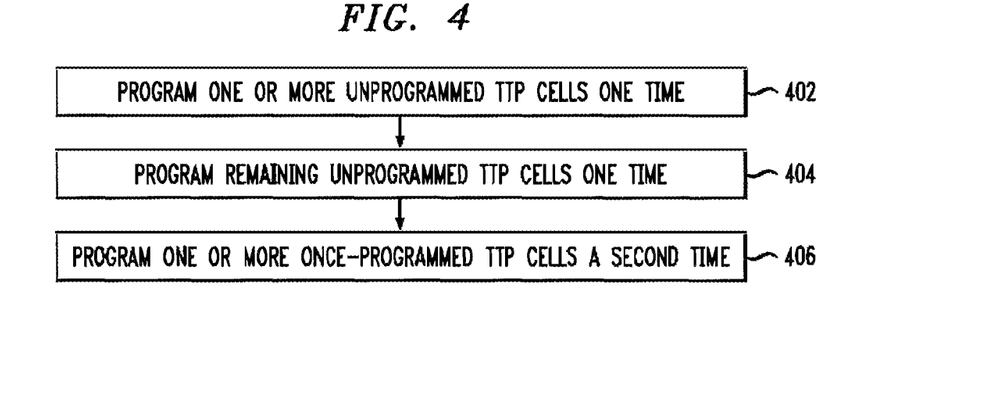
FIG. 4 is a flow diagram of a method for programming the array of FIG. 3.

FIG. 4 is a flow diagram of a method for programming the array 300 of FIG. 3. The method starts with all of the TTP cells 310 of the array being unprogrammed cells having unblown fuse devices 316 and unblown anti-fuse devices 314. In step 402, the array 300 is programmed for a first time, wherein one or more TTP cells 310 are sequentially programmed in any desired order for a first time (as described below with respect to Table III) by blowing their fuse devices 316, with any remaining TTP cells 310 being unprogrammed cells. After the array 300 has been programmed one time, one or more of the TTP cells 310 will be once-programmed cells having blown fuse devices 316, while the remaining TTP cells 310 in the array 300 will still be unprogrammed cells.

If and when it is desirable to program the array 300 a second time, in step 404, all of the remaining, unprogrammed TTP cells 310 are sequentially programmed for a first time, such that, after step 404, all of the TTP cells 310 of the array will be once-programmed cells with blown fuse devices 316. In step 406, one or more of the once-programmed TTP cells 310 in the array 300 are sequentially programmed in any desired order for a second time (as described below with respect to Table V) by blowing their anti-fuse devices 314. After the array 300 has been programmed two times, one or more of the TTP cells 310 will be twice-programmed cells having blown fuse devices 316 and blown anti-fuse devices 314, while the remaining TTP cells 310 in the array 300 will be once-programmed cells having blown fuse devices 316 and unblown anti-fuse devices 314.

Using the method of FIG. 4, the array 300 can be first programmed to store a first set of data, and then subsequently re-programmed to store a completely independent, second set of data.

Figure 5:
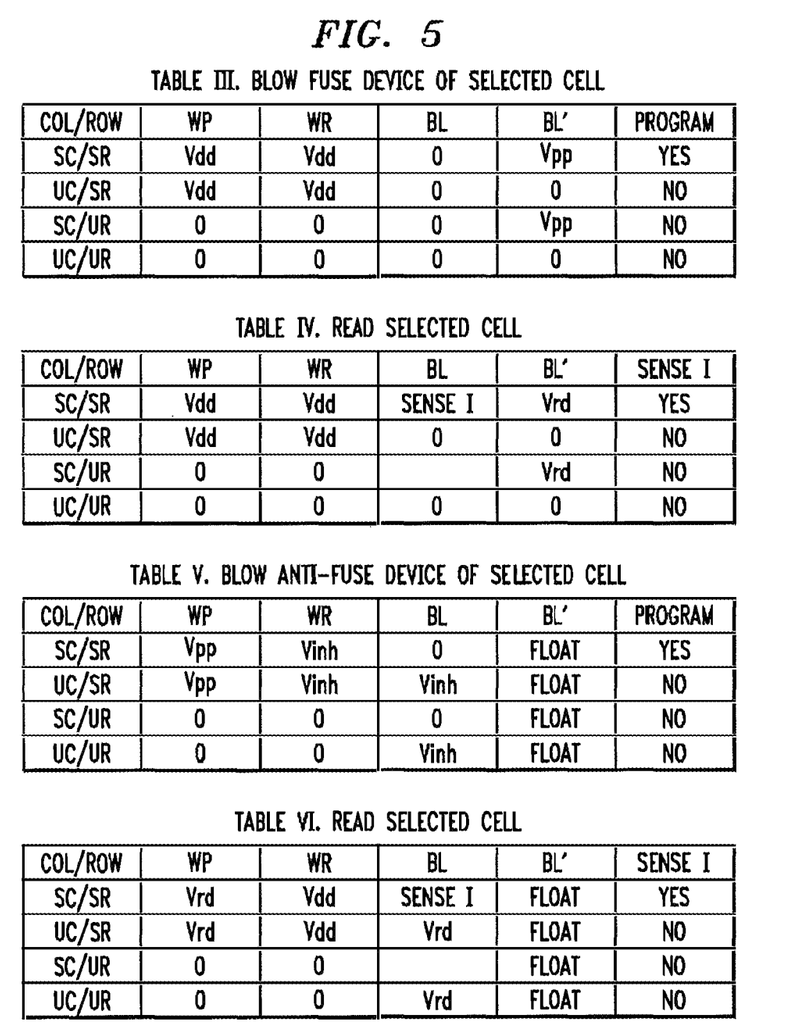
FIG. 5 presents Table which show the voltages to be applied to program and read a TTP cell of FIG. 3.

Table III of FIG. 5 shows the voltages to be applied to program a selected, unprogrammed TTP cell 310 in FIG. 3 for a first time. Table III applies to both the (2×2) array 300 shown in FIG. 3 as well as the larger array (not shown) of which the array 300 is only part. As shown in Table III, an appropriate voltage Vdd is applied to the programming word line WP of the selected row; a ground voltage is applied to the programming word line WP of each unselected row; the voltage Vdd is applied to the read word line WR of the selected row; a ground voltage is applied to the read word line WR of each unselected row; a ground voltage is applied to the first bit line BL of each column; an appropriate, relatively high, programming voltage Vpp is applied to the second bit line BL' of the selected column; and a ground voltage is applied to the second bit line BL' of each unselected column.

With the voltages of Table III applied, for the selected TTP cell 310 in the selected column and the selected row, the access device 312 and the anti-fuse device 314 will both be turned on, and a high-voltage difference (i.e., at or near Vpp) will be applied across the terminals of the fuse device 316, resulting in a significant and permanent increase in the resistance level of the fuse device.

For each unselected TTP cell 310 in the selected row, but in an unselected column, the access device 312 will be turned on, but the voltage difference across the terminals of the fuse device 316 will be at or near zero, such that the resistant level of the fuse device 316 will not be permanently altered. For each unselected TTP cell 310 in an unselected row, the access device 312 will be turned off, and the resistance level of the fuse device 316 will also not be altered.

After the array 300 has been programmed for a first time, one or more TTP cells 310 will be once-programmed cells having (i) blown fuse devices 316 with relatively large resistance levels and (ii) unblown anti-fuse devices 314, while the remaining TTP cells 310 will be unprogrammed cells having (i) unblown fuse devices 316 with relatively small resistance levels and (ii) unblown anti-fuse devices 314. The TTP cells 310 of the once-programmed array 300 can be read in any desired order as follows.

Table IV of FIG. 5 shows the voltages to be applied in order to read a selected TTP cell 310 in FIG. 3 after the array 300 has been programmed one time. In particular, an appropriate voltage Vdd is applied to the programming word line WP of the selected row; a ground voltage is applied to the programming word line WP of each unselected row; the voltage Vdd is applied to the read word line WR of the selected row; a ground voltage is applied to the read word line WR of each unselected row; a ground voltage is applied to the first bit line BL of each unselected column; an appropriate voltage Vrd is applied to the second bit line BL' of the selected column; a ground voltage is applied to the second bit line BL' of each unselected column (alternatively, the second bit line BL' can be floated); and the current in the first bit line BL of the selected column is sensed using the sense circuitry for that bit line.

With the voltages of Table IV applied, for the selected TTP cell 310 in the selected column and the selected row, the access device 312 and the anti-fuse device 314 will both be turned on. If the TTP cell 310 is an unprogrammed cell, then current will flow from the second bit line BL' through the unblown fuse device 316 and the turned-on anti-fuse and access devices 314 and 312 to the first bit line BL, and the sense circuitry will detect a (relatively) high-current state for that unprogrammed TTP cell 310. If the TTP cell 310 is a once-programmed cell, then little if any current will flow from the second bit line BL' through the high-resistance, blown fuse device 316. The resulting, relatively low current will flow through the turned-on anti-fuse and access devices 314 and 312 to the first bit line BL, and the sense circuitry will detect a (relatively) low-current state for that once-programmed TTP cell 310. Again, depending on the logic applied by the sense circuitry, the low-current state can be interpreted as either a binary value 0 or a binary value 1, and the high-current state will be interpreted as the other binary value.

For each unselected TTP cell 310 in the selected row, but in an unselected column, the anti-fuse and access devices 314 and 312 will both be turned on, but no current will flow in the corresponding (unselected) first bit line BL, since the first and second bit lines BL and BL' will both be at the same ground voltage. For each unselected TTP cell 310 in an unselected row, the anti-fuse and access devices 314 and 312 will both be turned off, and little if any current will flow to the first bit line BL whether the TTP cell 310 is an unprogrammed cell or a once-programmed cell.

Table V of FIG. 5 shows the voltages to be applied to program a selected, once-programmed TTP cell 310 in FIG. 3 for a second time. Table V applies to both the (2×2) array 300 shown in FIG. 3 as well as the larger array (not shown) of which the array 300 is only part. As shown in Table V, an appropriate, relatively high, programming voltage Vpp is applied to the programming word line WP of the selected row; a ground voltage is applied to the programming word line WP of each unselected row; an appropriate voltage Vinh is applied to the read word line WR of the selected row; a ground voltage is applied to the read word line WR of each unselected row; a ground voltage is applied to the first bit line BL of the selected column; the voltage Vinh is applied to the first bit line BL of each unselected column; and the second bit line BL' in both the selected column and each unselected column is floated.

With the voltages of Table V applied, for the selected TTP cell 310 in the selected column and the selected row, the access device 312 will be turned on, and a high-voltage difference (i.e., at or near Vpp) will be applied between the gate and source of the anti-fuse device 314, resulting in a permanent breakdown of the gate-oxide layer separating the gate terminal from the source and drain terminals, leaving a permanent conduction path through that gate-oxide layer.

For each unselected TTP cell 310 in the selected row, but in an unselected column, the access device 312 will be turned on, but the voltage difference between the gate and source of the anti-fuse device 314 will be only (Vpp-Vinh), where Vinh is selected such that the gate-oxide layer of the anti-fuse device 314 will not break down when that gate-to-source voltage difference is applied. For each unselected TTP cell 310 in an unselected row, the access device 312 and the anti-fuse device 314 will both be turned off, and the gate-oxide layer of the anti-fuse device 314 will also not break down. Note that the voltage Vinh applied to the first bit line BL is itself insufficient to break down the gate-oxide layer of the anti-fuse device 314 in an unselected TTP cell 310 in an unselected row, but the selected column.

After the array 300 has been programmed for a second time, one or more TTP cells 310 will be twice-programmed cells with high-resistance, blown fuse devices 316 and permanent conduction paths through the anti-fuse gate-oxide layers of their blown anti-fuse devices 314, while the remaining TTP cells 310 will be once-programmed cells with high-resistance, blown fuse devices 316 and the gate-oxide layers of their unblown anti-fuse devices 314 intact. The TTP cells 310 of the twice-programmed array 300 can be read in any desired order as follows.

Table VI of FIG. 5 shows the voltages to be applied in order to read a selected TTP cell 310 in FIG. 3 after the array 300 has been programmed two times. Table VI applies to both the (2×2) array 300 shown in FIG. 3 as well as the larger array (not shown) of which the array 300 is only part. In particular, an appropriate voltage Vrd is applied to the programming word line WP of the selected row; a ground voltage is applied to the programming word line WP of each unselected row; an appropriate voltage Vdd is applied to the read word line WR of the selected row; a ground voltage is applied to the read word line WR of each unselected row; the voltage Vrd is applied to the first bit line BL of each unselected column; each second bit line BL' is floated; and the current in the first bit line BL of the selected column is sensed using the sense circuitry for that bit line.

With the voltages of Table VI applied, for the selected TTP cell 310 in the selected column and the selected row, the access device 312 will be turned on. If the selected TTP cell 310 is a once-programmed cell having a high-resistance, blown fuse device 316 and an unblown anti-fuse device 314, then little if any current will flow from the anti-fuse device 314 through the turned-on access device 312 to the first bit line BL. If, however, the selected TTP cell 310 is a twice-programmed cell having a high-resistance, blown fuse device 316 and a blown anti-fuse device 314 with a permanent conduction path in its gate-oxide layer, then a significant amount of current will flow from the programming word line WP through the permanent conduction path in the anti-fuse device 314 and through the turned-on access device 312 to the first bit line BL. Thus, a once-programmed TTP cell 310 will have a (relatively) low-current state when read, while a twice-programmed TTP cell 310 will have a (relatively) high-current state when read. Depending on the logic applied by the sense circuitry, the low-current state will be interpreted as being either a binary value of 0 or a binary value of 1, while the high-current state will be interpreted as being the other binary value.

For each unselected TTP cell 310 in the selected row, but in an unselected column, the access device 312 will be turned on, but no current will flow in the corresponding (unselected) first bit line BL, since the first and second bit lines BL and BL' will both be at the same ground voltage. If such an unselected TTP cell 310 is a once-programmed cell having a high-resistance, blown fuse device 316 and an unblown anti-fuse device 314, then little if any current will flow through the anti-fuse device 314 to the unselected first bit line BL. If such an unselected TTP cell 310 is a twice-programmed cell having a high-resistance, blown fuse device 316 and a blown anti-fuse device 314 with a permanent conduction path through its gate-oxide layer, then the voltage Vrd applied to the unselected first bit line BL will prevent any significant current from flowing from the programming word line WP to that first bit line BL, since the same voltage Vrd will be applied to both the programming word line WP and the first bit line BL.

For each unselected TTP cell 310 in an unselected row, the access device 312 will be turned off, and little if any current will flow to the first bit line BL whether the TTP cell 310 is a once-programmed cell or a twice-programmed cell.

Figure 6:
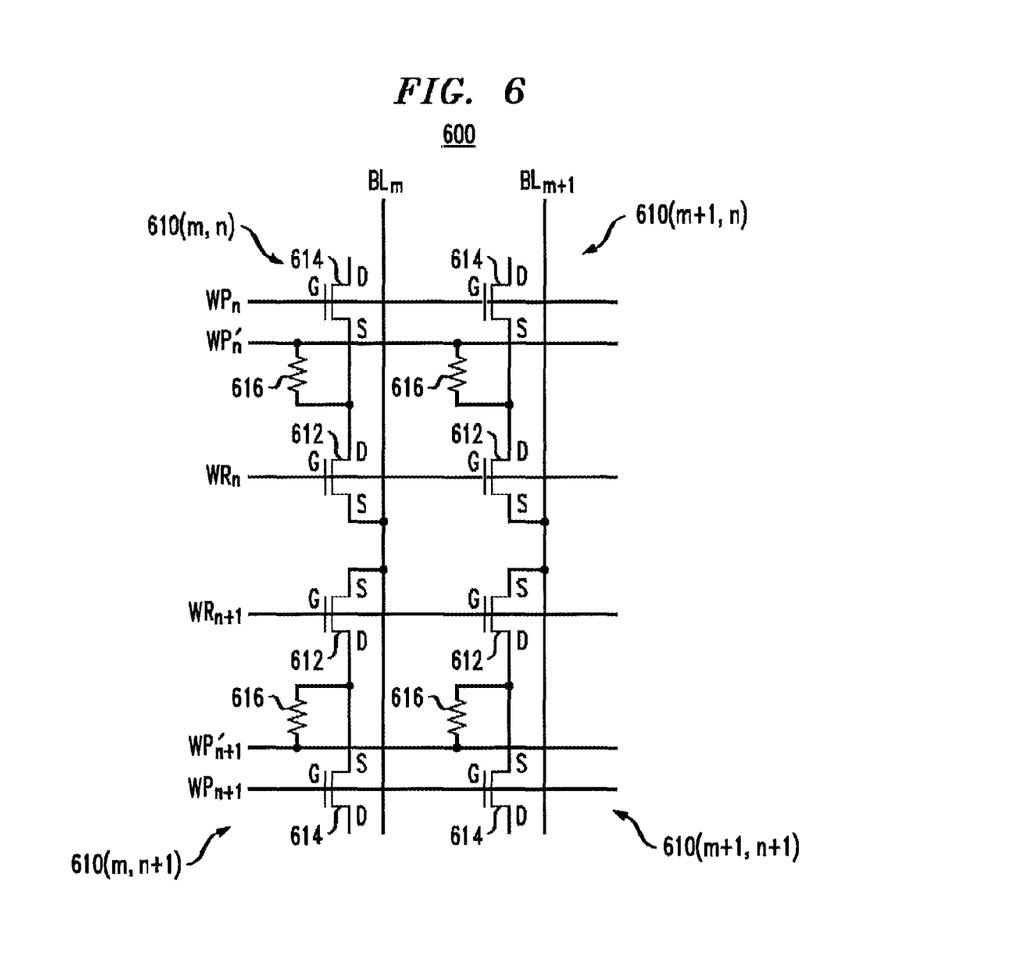
FIG. 6 is a schematic circuit diagram of a (2×2) array of n-type TTP cells.

FIG. 6 is a schematic circuit diagram of a (2×2) array 600 of n-type TTP cells 610, according to another embodiment of the invention, where each TTP cell 610 comprises an n-type access (transistor) device 612, an n-type anti-fuse (transistor) device 614, and a fuse (resistor) device 616. Array 600 is similar to array 300 of FIG. 3, with analogous elements labeled using analogous labels, except that (i) array 600 has a second programming word line WP' for each row of cells (instead of a second bit line BL' for each column of cells as in array 300) and (ii) each TTP cell 610 has a fuse device 616 connected between the second programming word line WP' and the shared terminal between the access device 612 and the anti-fuse device 614 (instead of a fuse device 316 connected between the drain of the anti-fuse device 314 and a second bit line BL' as in array 300). In TTP cell 610, the drain of the anti-fuse device is floating.

Similar to fuse device 316 of FIG. 3, fuse device 616 may be implemented using any suitable (two-terminal) element, such as a resistor susceptible to electromigration, whose resistance will permanently change when a certain amount of current flows through it or a certain level of voltage is applied (or develops) across it. Fuse device 616 can be, for example (and without limitation), (i) a contact that connects a portion of the second programming word line WP' implemented in the metal 1 layer to the common diffusion region shared by the access device 612 and the anti-fuse device 614 drain or (ii) a via (or stacks of vias) that connect a metal layer, such as a metal 2 layer, to another metal layer, such as a metal 1 layer, and more generally, via(s) connecting two or more metal layers, of the second programming word line WP'.

In one programming approach for the implementation of FIG. 6, the unprogrammed array 600 is programmed for a first time by programming one or more of the unprogrammed TTP cells 610 by blowing their anti-fuse devices 614, while the remaining TTP cells 610 are left unprogrammed. The blowing of the anti-fuse devices of such an array need not occur at the same time, such that a part of the anti-fuse devices may remain unprogrammed, while another part are programmed. In such example programming approach, analogously to the method of FIG. 4, to program the array 600 a second time, the remaining, unprogrammed TTP cells 610 are similarly programmed for a first time to generate once-programmed TTP cells with blown anti-fuse devices 614 and unblown fuse devices 616. Then, one or more of the once-programmed TTP cells 610 are programmed for a second time by blowing their fuse devices 616, thereby providing twice-programmed TTP cells 610 having blown anti-fuse devices 614 and blown fuse devices 616, while the remaining cells are once-programmed TTP cells 610 having blown anti-fuse devices 614 and unblown fuse devices 616.

Figure 7:
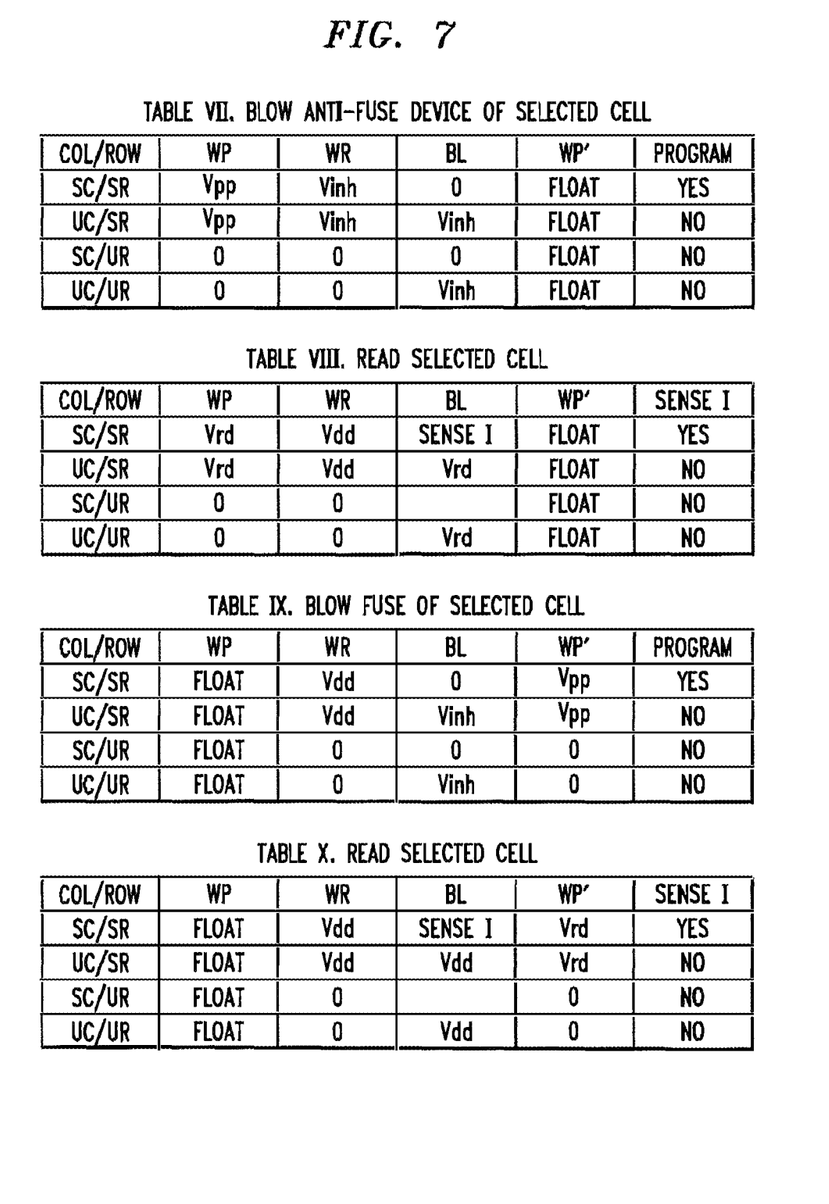
FIG. 7 presents Table VII-X, which show the voltages to be applied to program and read a TTP cell of FIG. 6.

Table VII of FIG. 7 shows the voltages to be applied to program a selected, unprogrammed TTP cell 610 in FIG. 6 for a first time. Table VII is analogous to Table V of FIG. 5, and the programming of an unprogrammed TTP cell 610 is analogous to the programming of a once-programmed TTP cell 310 of FIG. 3, except that the second programming word line WP' is floated, instead of the second word line BL'. After the array 600 has been programmed for a first time, one or more TTP cells 610 will be once-programmed cells with permanent conduction paths through the gate-oxide layers of their blown anti-fuse devices 614 and unblown fuse devices 616, while the remaining TTP cells 610 will be unprogrammed cells with the gate-oxide layers of their unblown anti-fuse devices 614 intact and unblown fuse devices 616. The TTP cells 610 of the once-programmed array 600 can be read in any desired order as follows.

Table VIII of FIG. 7 shows the voltages to be applied in order to read a selected TTP cell 610 in FIG. 6 after the array 600 has been programmed one time. Table VIII is analogous to Table VI of FIG. 5, and the reading of a TTP cell 610 in the once-programmed array 600 is analogous to the reading of a TTP cell 310 in the twice-programmed array 300 of FIG. 3, except that the second programming word line WP' is floated, instead of the second word line BL'. A once-programmed TTP cell 610 will have a (relatively) low-current state when read, while an unprogrammed TTP cell 610 will have a (relatively) high-current state when read.

Table IX of FIG. 7 shows the voltages to be applied to program a selected, once-programmed TTP cell 610 in FIG. 6 for a second time. As shown in Table IX, the first programming word line WP of each row is floated; an appropriate voltage Vdd is applied to the read word line WR of the selected row; a ground voltage is applied to the read word line WR of each unselected row; a ground voltage is applied to the bit line BL of the selected column; an appropriate voltage Vinh is applied to the bit line BL of each unselected column; an appropriate, relatively high, programming voltage Vpp is applied to the second programming word line WP' of the selected row; and a ground voltage is applied to the second programming word line WP' of each unselected row.

With the voltages of Table IX applied, for the selected TTP cell 610 in the selected column and the selected row, the access device 612 will be turned on, and a high-voltage difference (i.e., at or near Vpp) will be applied across the terminals of the fuse device 616, resulting in a significant and permanent increase in the resistance level of the fuse device.

For each unselected TTP cell 610 in the selected row, but in an unselected column, the access device 612 will be turned on, but the voltage difference across the terminals of the fuse device 616 will be at or near (Vpp-Vinh), where Vinh is selected such that the fuse device 616 will not blow when that voltage difference is applied. For each unselected TTP cell 610 in an unselected row, the access device 612 will be turned off, and the resistance level of the fuse device 616 will also not be altered.

After the array 600 has been programmed for a second time, one or more TTP cells 610 will be twice-programmed cells having (i) blown anti-fuse devices 614 and (ii) blown fuse devices 616 with relatively large resistance levels, while the remaining TTP cells 610 will be once-programmed cells having (i) blown anti-fuse devices 614 and (ii) unblown fuse devices 616 with relatively small resistance levels. The TTP cells 610 of the twice-programmed array 600 can be read in any desired order as follows.

Table X of FIG. 7 shows the voltages to be applied in order to read a selected TTP cell 610 in FIG. 6 after the array 600 has been programmed two times. In particular, the first programming word line WP of each row is floated; an appropriate voltage Vdd is applied to the read word line WR of the selected row; a ground voltage is applied to the read word line WR of each unselected row; the voltage Vdd is applied to the bit line BL of each unselected column; an appropriate voltage Vrd is applied to the second programming word line WP' of the selected column; a ground voltage is applied to the second programming word line WP' of each unselected column; and the current in the bit line BL of the selected column is sensed using the sense circuitry for that bit line.

With the voltages of Table X applied, for the selected TTP cell 610 in the selected column and the selected row, the access device 612 will be turned on, and the anti-fuse device 614 will be off. If the TTP cell 610 is a once-programmed cell, then current will flow from the second programming word line WP' through the unblown fuse device 616 and through the turned-on access device 612 to the bit line BL, and the sense circuitry will detect a (relatively) high-current state for that once-programmed TTP cell 610. If the TTP cell 610 is a twice-programmed cell, then little if any current will flow from the second programming word line WP' through the high-resistance, blown fuse device 616 and through the turned-on access device 612 to the bit line BL, and the sense circuitry will detect a (relatively) low-current state for that twice-programmed TTP cell 610.

For each unselected TTP cell 610 in the selected row, but in an unselected column, the access device 612 will be turned on, but any current in the corresponding (unselected) bit line BL will be ignored. For each unselected TTP cell 610 in an unselected row, the access device 612 will be turned off, and little if any current will flow to the bit line BL whether the TTP cell 610 is a once-programmed cell or a twice-programmed cell.

There may be different sets of voltages beyond those presented in the Tables III-X that can be employed to program and/or read the TTP cells of the present invention. In general, a suitable set of programming voltages is one that applies an appropriate voltage difference to blow the desired fuse or anti-fuse device of the selected TTP cell without blowing any other fuse or anti-fuse device in the array. Similarly, a suitable set of reading voltages is one that establishes an appropriate amount of current through the selected TTP cell that distinguishes between the selected TTP cell being unprogrammed or once-programmed or between the selected TTP cell being once-programmed or twice-programmed without establishing any significant amount of current through any other (unselected) TTP cell in that same column. In particular, the above detailed example was for programming the anti-fuse devices first in order to provide a first-programmed array. However, another implementation provides for programming the fuse devices first, to provide a first-programmed array. Based on the above disclosures, a person of ordinary skill can deduce programming settings for the word lines for the anti-fuse and fuse devices of selected and unselected rows, as well as bit line voltages for selected and selected columns. At a high level, in order to program a selected fuse (and not program an unselected fuse), a selected row read line (to enable the read devices of that row) is activated, thus electrically coupling respective nodes shared by the fuse and source of the anti-fuse device for cells in the selected row. The bitline in a selected column can be brought low, and a high voltage applied to the word line of the fuse devices of the selected row. In order to avoid blowing fuses of cells in unselected columns in the selected row, bitlines in those unselected columns can be made high impedance, such that comparatively negligible current flows through the fuses in cells of unselected columns. In order to avoid blowing the anti-fuse devices in the selected row, the word line for the anti-fuse devices is maintained low or not driven. For unselected rows, the row enable line can remain off.

It will be further understood that the suitable voltage configurations will vary for different semiconductor technologies. Lower-voltage semiconductor technologies will typically have voltage configurations with lower voltage levels, and vice versa. In some implementations, the invention enables programmed TTP cells to be read using voltage levels no higher than the power supply voltage for the instant semiconductor technology. As such, such programmed TTP cells can be read without needing charge pumps to provide voltage levels greater than the power supply voltage.

In an exemplary 1-volt semiconductor technology, Vdd=1 volt, Vpp=5 volts, Vrd=0.6-1.0 volts, and Vinh=1.8-2.5 volts. Other voltages would apply to other technologies.

In the TTP cells 310 and 610 of FIGS. 3 and 6, the programming word line WP functions as a programming node for the anti-fuse device 314 or 614. In the TTP cells 310, the second bit line BL' functions as a programming node for the fuse device 316, while, in the TTP cells 610, the second programming word line WP' functions as a programming node for the fuse device 616.

Although the present disclosure has been described in the context of two-dimensional memories having multiple rows and multiple columns of TTP cells, the invention is not so limited. Other embodiments include one-dimensional memories having a single row of TTP cells or a single column of TTP cells, as well as individual TTP cells.

The present disclosure has been described in the context of two different types of TTP cells having fuse devices in two different locations. Other types of TTP cells are possible in which the fuse device is in a further different location. For example, a fuse device may located at the gate of the anti-fuse device. In some memory arrays, one poly line or metal-gate line forms the gates of all of the anti-fuse devices in a row, and contact(s) are provided at the edge of the array (e.g., at the end of the row) for connection or application of voltages on the corresponding programming word line WP. To locate fuse devices at the gates of a row of anti-fuse devices, a different fuse contact is implemented between the corresponding programming word line WP and the gate of each anti-fuse device. The programming sequence for such an embodiment would involve blowing the anti-fuse gate-oxide layer first and the fuse contact last. The programming and read operations of FIG. 2 could be applied for both (i) the first-time programming and read operations and (ii) the second-time programming and read operations, although the programming pulse durations and/or magnitudes may differ. The first- and second-time read operations can be the same. Such an embodiment eliminates the need for a second bit line, like bit line BL' of FIG. 3, or a second programming word line, like programming word line WP' of FIG. 6.

The present disclosure has been described in the context of N-type TTP cells. Those skilled in the art will understand that the invention can also be implemented in the context of P-type TTP cells. To program and read such P-type TTP cells, the biases on the read and/or programming word lines and/or the bit lines may need to be reversed.

Although the present invention has been described in the context of a TTP cell that can be selectively programmed two times to store one bit value at a time, the TTP cell can also be programmed to store simultaneously two different bit values, where the two different bit values can be read from the TTP cell sequentially. For example, each TTP cell 310 of FIG. 3 can be programmed to store (i) a first bit value by selectively either blowing or not blowing the fuse device 316 and (ii) a second bit value by selectively either blowing or not blowing the anti-fuse device 314. The first bit value can be read by applying a set of appropriate voltages to detect whether or not the fuse device 316 has been blown, and the second bit value can be read (either before or after reading the first bit value) by applying a different set of appropriate voltages to detect whether or not the anti-fuse device 314 has been blown.

The present disclosure has been described in the context of TTP cells having a single anti-fuse device and a single fuse device that enable each cell to be programmed two times. In general, the disclosure can be extended to include multi-time programmable (MTP) cells having one or more anti-fuse devices and one or more fuse devices configured to enable each cell to be programmed two or more times. For example, a three-time programmable cell can be implemented having (i) one anti-fuse device analogous to the anti-fuse device 314 of FIG. 3 and (ii) two fuse devices: one fuse device analogous to the fuse device 316 of FIG. 3 and a second fuse device analogous to the fuse device 616 of FIG. 6. Such a three-time programmable cell would have two bit lines analogous to the two bit lines BL and BL' of FIG. 3 and three word lines analogous to the three word lines WP, WP', and WR of FIG. 6. In another embodiment, an MTP cell could have two or more fuse devices analogous to fuse device 616 of FIG. 6, each having its own word line analogous to word line WP' of FIG. 6 and the two or more fuse devices configured in parallel to one another between their respective word lines and the shared terminal between the access device 612 and the anti-fuse device 614.

MTP cells of the invention can be used in any suitable circuitry requiring low power, low cost, multi-time programmable circuitry. As mentioned previously, this includes non-volatile memory (NVM) used, for example and without limitation, for chip configuration, code storage, encryption, ID tags, memory repair to increase yield in larger memories, and pixel repair for imaging applications. The types of integrated circuits in which MTP cells of the invention could be implemented include field-programmable gate arrays (FPGAs), mask-programmable gate arrays, analog circuits, application specific integrated circuits (ASICs), and general-purpose processors for any suitable applications including (without limitation) smart phone and mobile device applications and IOT (Internet of Things) devices. In one particular embodiment, an array of different instances of the MTP cells of the invention form configuration memory for an FPGA.

MTP cells of the invention can be fabricated using a standard complementary metal-oxide semiconductor (CMOS) process flow. Since the anti-fuse device 614 functions as a capacitor in the TTP cell 610 of FIG. 6, the anti-fuse device 614 can be fabricated as either a capacitor or a MOS transistor while the access device 612 is a MOS transistor. The devices described in this application can be manufactured with bulk CMOS technology, as well as silicon-on-insulator (SOI) technology, such as fully-depleted SOI technology.

Figure 8:
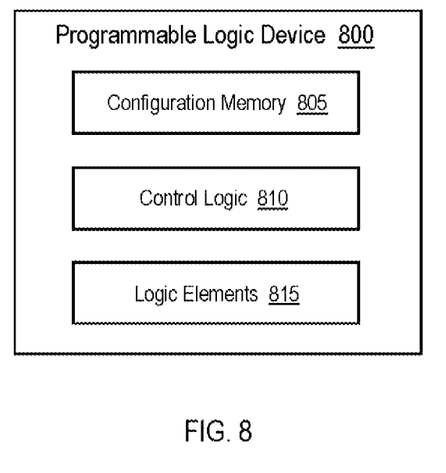
FIG. 8 illustrates an example programmable logic device.

FIG. 8 illustrates an example programmable logic device (PLD) 800. The PLD 800 includes a non-volatile configuration memory 805, control logic 810, and logic elements 815. The non-volatile configuration memory 805 may include a memory array of non-volatile bitcells arranged as an n by m matrix of rows and columns. Each bitcell has a respective plurality of one-time programmable elements. The memory array may be used as storage for configuration data used for configuring a programmable logic device. The control logic 810 is configured to present the non-volatile configuration memory 805 as a n×m matrix of bit locations, with each bit location capable of being programmed once for each of the plurality of one-time programmable elements in that memory cell. The memory array may be formed on the same semiconductor substrate as devices forming the programmable logic device 800. The programmable logic device 800 includes circuitry for accessing configuration data from the memory array and using that configuration data to configure the logic elements 815 of the programmable logic device. The bitcells of the memory array may each include one anti-fuse element, and one or more fuse elements, and each of the bitcells requires no more area on a semiconductor substrate than a single-bit anti-fuse memory cell requires.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding terminals, nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

Semiconductor circuitry Implementations of the invention are made using a process technology to form circuitry on a wafer. For example, some implementations can use a planar semiconductor fabrication process. One metric for evaluating the effectiveness or value of a semiconductor circuit is an amount of area required. For a memory, such metric can be evaluated as an area required for each bit. Such evaluation requires setting certain parameters, such as design rules for the process and for memory elements in the process. Under a given set of assumptions or parameter set, a non-volatile memory cell that includes an anti-fuse element and an access device would require a certain area. In some implementations, the area required for multiple time programmable memory cells or multiple bit memory cells is no greater than the area required for only the access device and the anti-fuse device. Thus, some implementations provide double the non-volatile memory density than using anti-fuse technology along. Still further implementations may provide triple or higher density.

Integrated circuits have become increasingly complex. Entire systems are constructed from diverse integrated circuit sub-systems. Describing such complex technical subject matter at an appropriate level of detail becomes necessary. In general, a hierarchy of concepts is applied to allow those of ordinary skill to focus on details of the matter being addressed.

Describing portions of a design (e.g., different functional units within an apparatus or system) according to functionality provided by those portions is often an appropriate level of abstraction, since each of these portions may themselves comprise hundreds of thousands, hundreds of millions, or more elements. When addressing some particular feature or implementation of a feature within such portion(s), it may be appropriate to identify substituent functions or otherwise characterize some sub-portion of that portion of the design in more detail, while abstracting other sub-portions or other functions.

A precise logical arrangement of the gates and interconnect (a netlist) implementing a portion of a design (e.g., a functional unit) can be specified. How such logical arrangement is physically realized in a particular chip (how that logic and interconnect is laid out in a particular design) may differ in different process technologies and/or for a variety of other reasons. Circuitry implementing particular functionality may be different in different contexts, and so disclosure of a particular circuit may not be the most helpful disclosure to a person of ordinary skill. Also, many details concerning implementations are often determined using design automation, proceeding from a high-level logical description of the feature or function to be implemented. In various cases, describing portions of an apparatus or system in terms of its functionality conveys structure to a person of ordinary skill in the art. As such, it is often unnecessary and/or unhelpful to provide more detail concerning a portion of a circuit design than to describe its functionality.

Functional modules or units may be composed of circuitry, where such circuitry may be fixed function, configurable under program control or under other configuration information, or some combination thereof. Functional modules themselves thus may be described by the functions that they perform, to helpfully abstract how some of the constituent portions of such functions may be implemented. In some situations, circuitry, units, and/or functional modules may be described partially in functional terms, and partially in structural terms. In some situations, the structural portion of such a description may be described in terms of a configuration applied to circuitry or to functional modules, or both.

Configurable circuitry is effectively circuitry or part of circuitry for each different operation that can be implemented by that circuitry, when configured to perform or otherwise interconnected to perform each different operation. Such configuration may come from or be based on instructions, microcode, one-time programming constructs, embedded memories storing configuration data, and so on. A unit or module for performing a function or functions refers, in some implementations, to a class or group of circuitry that implements the functions or functions attributed to that unit. Identification of circuitry performing one function does not mean that the same circuitry, or a portion thereof, cannot also perform other functions concurrently or serially. In the present circumstances, a control unit as described includes programmable and/or fixed-function circuitry that applies a self-consistent programming and/or read voltage pattern to selected and unselected rows and columns of an array of bitcells according to the disclosure. Such circuitry may include switches or multiplexers to selectively apply a particular voltage to a particular node, at a time and for a duration indicated. Control signals to such switches can be generated by control logic, which can be programmable and/or fixed function. Such control logic may track a state of the array of bitcells (e.g., whether it has been programmed zero, once or twice.) Voltages applied to lines of the array may be varied in dependence on such information, as would be apparent to those of skill in the art from the above disclosure.

Although circuitry or functional units may typically be implemented by electrical circuitry, and more particularly, by circuitry that primarily relies on transistors fabricated in a semiconductor, the disclosure is to be understood in relation to the technology being disclosed. For example, different physical processes may be used in circuitry implementing aspects of the disclosure, such as optical, nanotubes, micro-electrical mechanical elements, quantum switches or memory storage, magnetoresistive logic elements, and so on. Although a choice of technology used to construct circuitry or functional units according to the technology may change over time, this choice is an implementation decision to be made in accordance with the then-current state of technology.

Embodiments according to the disclosure include non-transitory machine readable media that store configuration data or instructions for causing a machine to execute, or for configuring a machine to execute, or for describing circuitry or machine structures (e.g., layout) that can execute or otherwise perform, a set of actions or accomplish a stated function, according to the disclosure. Such data can be according to hardware description languages, such as HDL or VHDL, in Register Transfer Language (RTL), or layout formats, such as GDSII, for example.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A programmable logic device, comprising:
   logic elements that are configurable using configuration data;
   a non-volatile configuration memory for storing the configuration data, the non-volatile configuration memory comprising:
     a read enable device connected to a first bitline and a read word line; and
     a plurality of memory cells arranged as an n by m matrix of rows and columns,
     wherein each memory cell comprises a respective plurality of one-time programmable elements, and
     wherein a first memory cell of the plurality of memory cells comprises:
       a first element connected to a first write line and the read enable device; and
       a second element connected to a second bitline and connected between a second write line and the read enable device; and
   control logic configured to present the non-volatile configuration memory as an n by m matrix of bit locations, each bit location capable of being programmed once for each of the plurality of one-time programmable elements in the memory cell, wherein each memory cell of the plurality of memory cells is associated with either a binary value of 0 or a binary value of 1 based on a state of each of the plurality of one-time programmable elements of the memory cell.

2. The programmable logic device of claim 1, wherein the one-time programmable elements in each of the plurality of memory cells comprise an anti-fuse memory element and one or more fuse elements, and wherein each of the plurality of memory cells requires no more area on a semiconductor substrate than a memory cell comprising the anti-fuse memory element requires.

3. The programmable logic device of claim 1, wherein the control logic is further configured to:
   program a second memory cell of the plurality of memory cells to set the second memory cell to the binary value of 1 by programming a first one-time programmable element of the plurality of one-time programmable elements of the second memory cell;
   after programming the second memory cell, reprogram the second memory cell to set the second memory cell to the binary value of 0 by programming a second one-time programmable element of the plurality of one-time programmable elements of the second memory cell; and
   after reprogramming the second memory cell, reprogram the second memory cell to set the second memory cell to the binary value of 1 by programming a third one-time programmable element of the plurality of one-time programmable elements of the second memory cell.

4. The programmable logic device of claim 1, wherein:
   the read enable device comprises a source coupled with the first bitline;
   the first element comprises a gate coupled with the first write line, a floating drain, and a source coupled with a drain of the read enable device; and
   the second element is coupled between the second write line and the drain of the read enable device.

5. The programmable logic device of claim 4, wherein the first element and the second element are independently programmable.

6. The programmable logic device of claim 4, wherein the first memory cell is programmable one time by programming the first element and programmable another time by programming the second element.

7. The programmable logic device of claim 4, wherein the first element is an anti-fuse device and the second element is a fuse device.

8. The programmable logic device of claim 4, wherein the first memory cell is associated with a first binary state when the first element is programmed, and wherein the first memory cell is associated with a second binary state different from the first binary state when both the first element and the second element are programmed.

9. The programmable logic device of claim 1, wherein the control logic is further configured to:
   program the non-volatile configuration memory with a first set of the configuration data by programming a first set of the plurality of memory cells; and
   after programming the non-volatile configuration memory with the first set of the configuration data, reprogram the non-volatile configuration memory with a second set of the configuration data by programming a second set of the plurality of memory cells, wherein the first set of the plurality of memory cells has at least one memory cell in common with the second set of the plurality of memory cells.

10. The programmable logic device of claim 9, wherein the programming the first set of the plurality of memory cells comprises programming, for each memory cell of the first set, at least one of the plurality of one-time programmable elements in the memory cell.

11. The programmable logic device of claim 10, wherein:
   the programming the first set of the plurality of memory cells comprises programming a first one-time programmable element of the at least one of the plurality of one-time programmable elements; and
   the programming the second set of the plurality of memory cells comprises programming a second one-time programmable element of the at least one of the plurality of one-time programmable elements.

12. The programmable logic device of claim 1, wherein the second element is connected to the second bitline and a drain of the first element.

13. A method, comprising:
   storing, in a non-volatile configuration memory of a programmable logic device, configuration data, wherein the non-volatile configuration memory comprises:
     a read enable device connected to a first bitline and a read word line; and a plurality of memory cells arranged as an n by m matrix of rows and columns,
wherein each memory cell comprises a respective plurality of one-time programmable elements, and
wherein a first memory cell of the plurality of memory cells comprises:
 a first element connected to a first write line and the read enable device; and
 a second element connected to a second bitline and connected between a second write line and the read enable device; and
presenting the non-volatile configuration memory as an n by m matrix of bit locations, wherein each bit location is capable of being programmed once for each of the plurality of one-time programmable elements in the memory cell, and wherein each memory cell of the plurality of memory cells is associated with either a binary value of 0 or a binary value of 1 based on a state of each of the plurality of one-time programmable elements of the memory cell.

14. The method of claim 13, further comprising:
programming a second memory cell of the plurality of memory cells to set the second memory cell to the binary value of 1 by programming a first one-time programmable element of the plurality of one-time programmable elements of the second memory cell; and
after the programming, reprogramming the second memory cell to set the second memory cell to the binary value of 0 by programming a second one-time programmable element of the plurality of one-time programmable elements of the second memory cell, wherein a drain of the read enable device is connected to the first element and the second element.

15. The method of claim 14, further comprising:
after the reprogramming, reprogramming the second memory cell to set the second memory cell to the binary value of 1 by programming a third one-time programmable element of the plurality of one-time programmable elements of the second memory cell.

16. The method of claim 13, wherein:
the read enable device comprises a source coupled with the first bitline; and
the first element comprises a gate coupled with the first write line, a floating drain, and a source coupled with a drain of the read enable device; and
the second element is coupled between the second write line and the drain of the read enable device.

17. The method of claim 16, wherein the first element and the second element are independently programmable, and wherein the first element is an anti-fuse device and the second element is a fuse device.

18. The method of claim 13, further comprising:
programming the non-volatile configuration memory with a first set of the configuration data by programming a first set of the plurality of memory cells; and
after the programming, reprogramming the non-volatile configuration memory with a second set of the configuration data by programming a second set of the plurality of memory cells, wherein the first set of the plurality of memory cells has at least one memory cell in common with the second set of the plurality of memory cells.

19. The method of claim 13, further comprising applying a voltage to a bitline based on a subset of the bit locations, wherein each bit location is associated with the binary value of 0 or the binary value of 1, and wherein the second element is connected to the second write line.

* * * * *

UNITED STATES PATENT AND TRADEMARK OFFICE
CERTIFICATE OF CORRECTION

PATENT NO. : 11,295,825 B2
APPLICATION NO. : 16/285037
DATED : April 5, 2022
INVENTOR(S) : Farrokh Kia Omid-Zohoor, Nguyen Duc Bui and Binh Ly It is certified that error appears in the above-identified patent and that said Letters Patent is hereby corrected as shown below:

On the Title Page

On Page 2, in Item (60) the Related U.S. Application Data, change "Provisional application No. 62/212,686 filed on Sep. 1, 2016." to --Provisional application No. 62/212,686 filed on Sep. 1, 2015.--

Signed and Sealed this
Twenty-seventh Day of September, 2022

Katherine Kelly Vidal
*Director of the United States Patent and Trademark Office*